United States Patent
Lee

(10) Patent No.: US 7,189,622 B2
(45) Date of Patent: Mar. 13, 2007

(54) METHOD FOR FABRICATING SEMICONDUCTOR DEVICE

(75) Inventor: Sung Joon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 11/169,708

(22) Filed: Jun. 30, 2005

(65) Prior Publication Data

US 2006/0148149 A1    Jul. 6, 2006

(30) Foreign Application Priority Data

Dec. 30, 2004    (KR)   ................... 10-2004-0117091

(51) Int. Cl.
*H01L 21/336*    (2006.01)

(52) U.S. Cl. .................. 438/296; 438/738; 438/287
(58) Field of Classification Search ................ 438/197, 438/287, 296, 591, 257, 262, 218, 738
See application file for complete search history.

(56) References Cited

U.S. PATENT DOCUMENTS

2004/0182815 A1*   9/2004   Lee et al. ............... 216/13
2006/0073661 A1*   4/2006   Lee ......................... 438/296

* cited by examiner

*Primary Examiner*—Theresa T. Doan
(74) *Attorney, Agent, or Firm*—Heller Ehrman LLP

(57) ABSTRACT

A method for fabricating a semiconductor device is disclosed. The method provides etching a predetermined region of a semiconductor substrate prior to formation of a device isolation film defining an active region and forming a gate having a stepped gate channel.

10 Claims, 7 Drawing Sheets

METHOD FOR FABRICATING SEMICONDUCTOR DEVICE

BACKGROUND OF THE INVENTION

1. Field of the Invention

The present invention generally relates to a method for fabricating a semiconductor device, and more specifically, to a method for fabricating a semiconductor device wherein a predetermined region of a semiconductor substrate is etched prior to formation of a device isolation film defining an active region to form a gate having a stepped gate channel, so as to decrease a leakage current of a storage node junction region, thereby improving a refresh characteristic of the semiconductor device.

2. Description of the Related Art

FIGS. 1a through 1f are cross-sectional views illustrating a conventional method for fabricating a semiconductor device.

Referring to FIG. 1a, a pad oxide film 12 and a pad nitride film are formed on a semiconductor substrate 11.

Referring to FIG. 1b, the pad oxide film 12, the pad nitride film 13 and a predetermined thickness of the semiconductor substrate to form a trench 14 defining an active region.

Referring to FIG. 1c, a sidewall oxide film (not shown) is formed on a surface of the trench 14. A liner nitride film (not shown) is then deposited on the entire surface including the surface of the trench 14. Thereafter, a HDP high density plasma oxide film (not shown) filling up the trench 14 is formed.

Next, the HDP oxide film (not shown) is subjected to a CMP process to expose the pad nitride film 13. The pad nitride film 13 is then removed to form a device isolation film 15.

Referring to FIG. 1d, a photoresist film (not shown) is deposited on the semiconductor substrate 11. Thereafter, the photoresist film is exposed and developed to form a photoresist film pattern (not shown) exposing a predetermined region. The exposed predetermined region includes a storage node contact region and a portion of a gate region adjacent thereto.

Thereafter, the exposed semiconductor substrate 11 is etched using the photoresist film pattern as an etching mask. The photoresist film pattern is then removed.

Referring to FIG. 1e, the pad oxide film 12 is removed. A buffer oxide film (not shown) is then formed. Thereafter, the active region of the semiconductor substrate 11 is subjected to an ion-implant process to form a well region. The buffer oxide film (not shown) is then removed.

Next, a stacked structure of a gate oxide film 16, a gate polysilicon layer 17, a gate silicide layer 18 and a hard mask nitride film 19 is sequentially deposited and then patterned to form a gate.

The active region of the semiconductor device manufactured in accordance with the above-described conventional method has a silicon horn at the top edge thereof under the gate as shown in FIG. 1f, which, in turn, degrades the characteristics of the semiconductor device.

Accordingly, drawbacks such as the gate oxide integrity problem and a cell turn-on characteristic degradation occur.

SUMMARY OF THE INVENTION

Accordingly, it is an object of the present invention to provide a method for fabricating a semiconductor device wherein a predetermined region of a semiconductor substrate is etched prior to formation of a device isolation film defining an active region to form a gate having a stepped gate channel, so as to decrease a leakage current of a storage node junction region, thereby improving a refresh characteristic of the semiconductor device.

In order to achieve the above object of the present invention, there is provided a method for fabricating a semiconductor substrate, comprising the steps of:

(a) etching a predetermined region of a semiconductor substrate, wherein the predetermined region includes a storage node contact region and a portion of a gate region adjacent thereto, (b) sequentially forming a lower pad oxide film, a lower pad nitride film, an upper pad oxide film and an upper pad nitride film on the semiconductor substrate, (c) etching a predetermined region of the upper pad nitride film, the upper pad oxide film, the lower pad nitride film, the lower pad oxide film and the semiconductor substrate to form a trench defining an active region, (d) depositing a HDP oxide film filling up the trench, (e) subjecting the HDP oxide film to a CMP process to expose the upper pad nitride film, (f) removing the upper pad nitride film, the upper pad oxide film, the lower pad nitride film and the lower pad oxide film, and (g) depositing and patterning a gate oxide film, a gate polysilicon layer, a gate silicide layer and a hard mask nitride film to form a gate.

DETAILED DESCRIPTION OF THE PREFERRED EMBODIMENTS

Reference will now be made in detail to exemplary embodiments of the present invention. Wherever possible, the same reference numbers will be used throughout the drawings to refer to the same or like parts.

FIGS. 2a through 2f are cross-sectional views illustrating a method for fabricating a semiconductor device according to a preferred embodiment of the present invention.

Figure 1A:
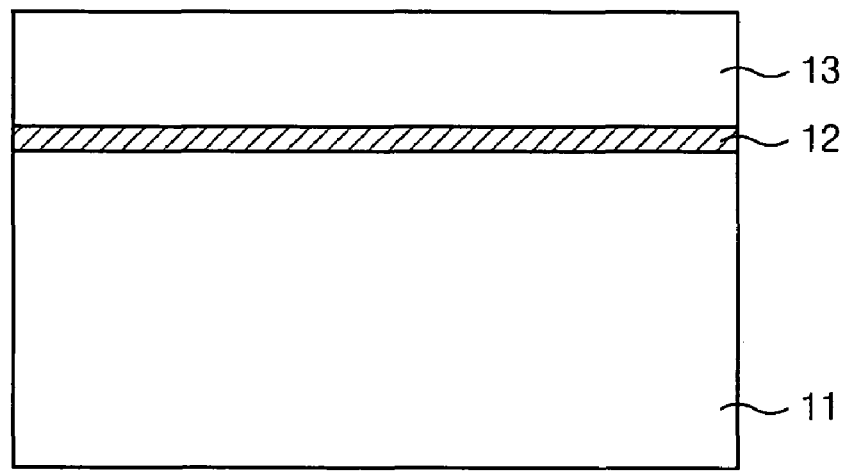
FIGS. 1a through 1f are cross-sectional views illustrating a conventional method for fabricating a semiconductor device.
Figure 1B:
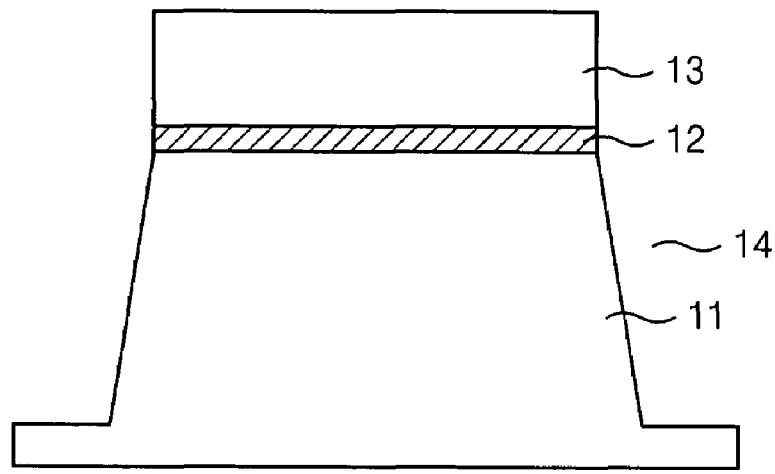
Figure 1C:
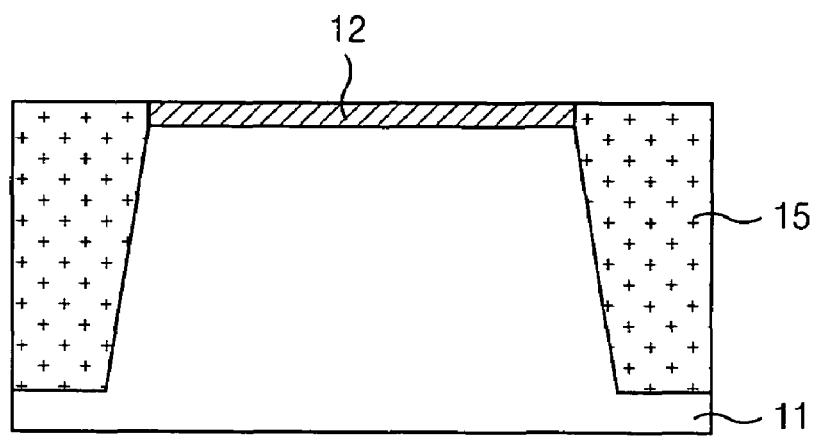
Figure 1D:
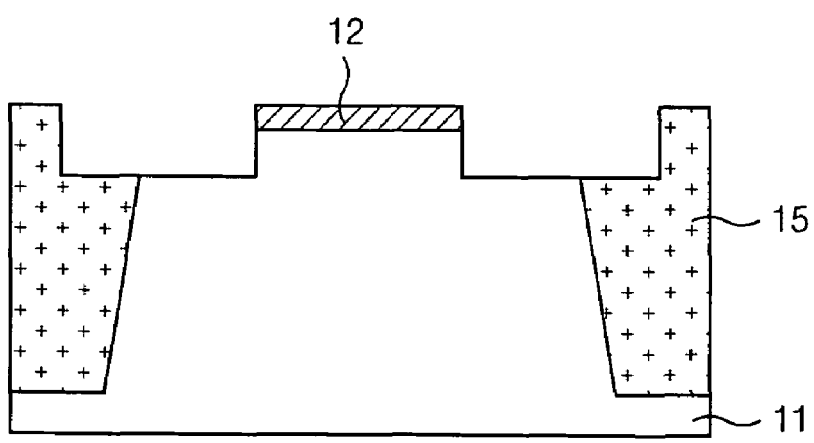
Figure 1E:
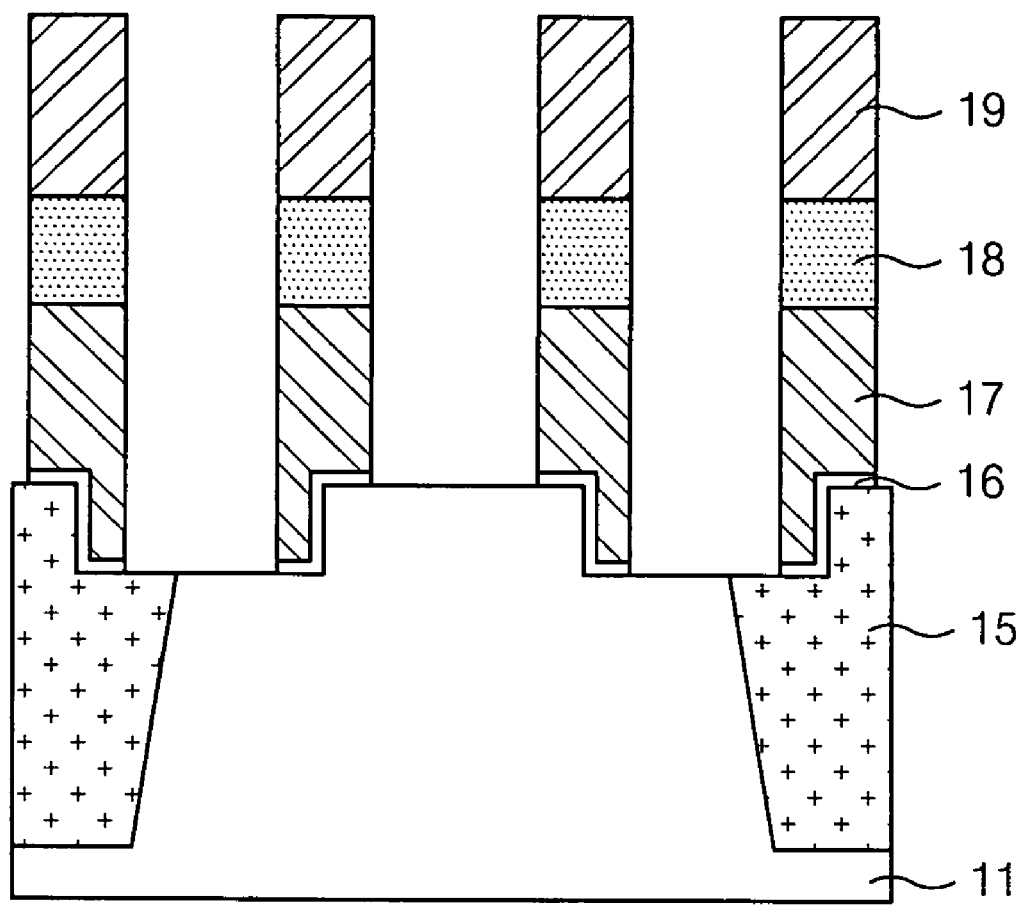
Figure 1F:
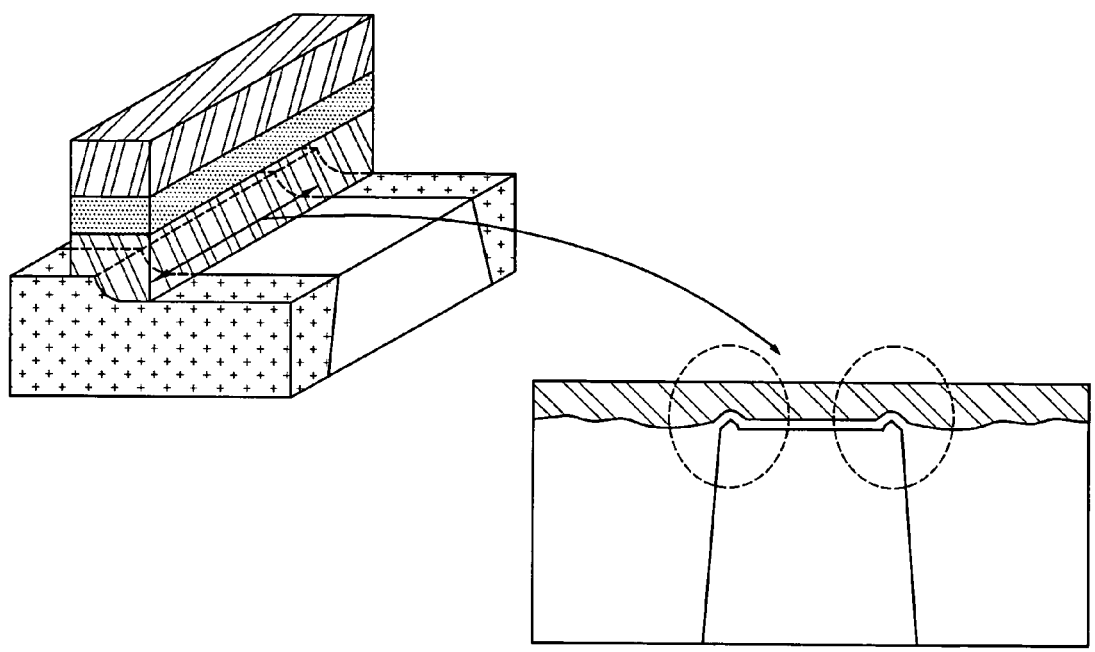
Figure 2A:
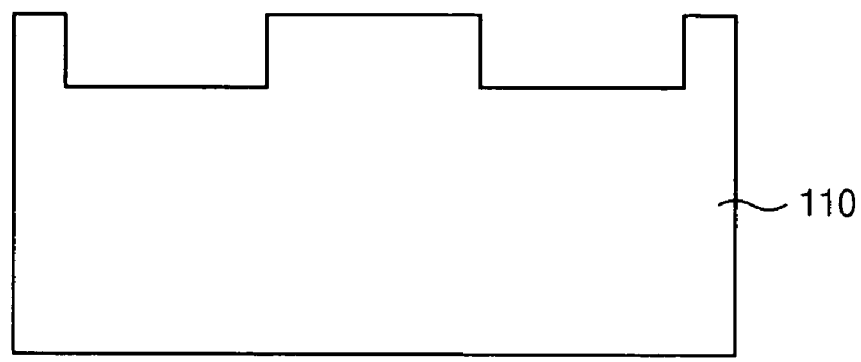
FIGS. 2a through 2f are cross-sectional views illustrating a method for fabricating a semiconductor device in accordance with a preferred embodiment of the present invention.

Referring to FIG. 2a, a predetermined region of a semiconductor substrate 110 is etched. The predetermined region includes a storage node contact region and a portion of a gate region adjacent thereto. Preferably, the thickness of the semiconductor substrate 110 etched during the etching process ranges from 300 Å to 600 Å.

Figure 2B:
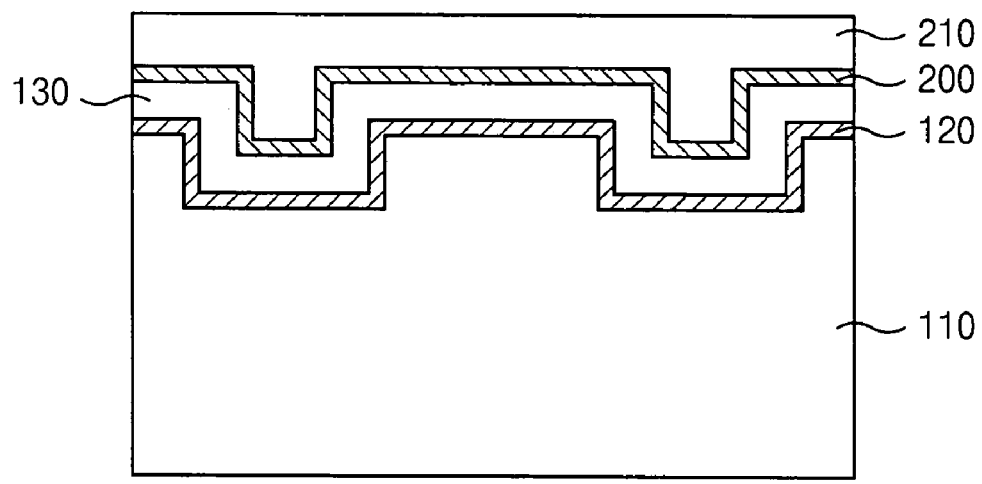

Referring to FIG. 2b, a lower pad oxide film 120, a lower pad nitride film 130, an upper pad oxide film 200 and an upper pad nitride film 210 are sequentially formed on the semiconductor substrate 110.

Preferably, a thickness of the pad oxide film 120 ranges from 30 Å to 150 Å, and thicknesses of the lower pad nitride film 130 and the upper pad nitride film 210 range from 200 Å to 300 Å and from 300 Å to 400 Å, respectively.

Figure 2C:
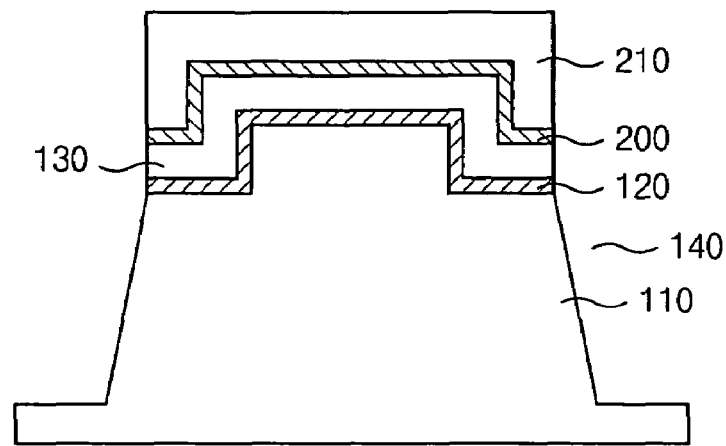

Referring to FIG. 2c, a predetermined region of the upper pad nitride film 210, the upper pad oxide film 200, the lower pad nitride film 130, the lower pad oxide film 120 and a predetermined thickness of the semiconductor substrate 110 are etched to form a trench 140 defining an active region. Here, a depth of the trench 140 preferably ranges from 2000 Å to 3000 Å.

Figure 2D:
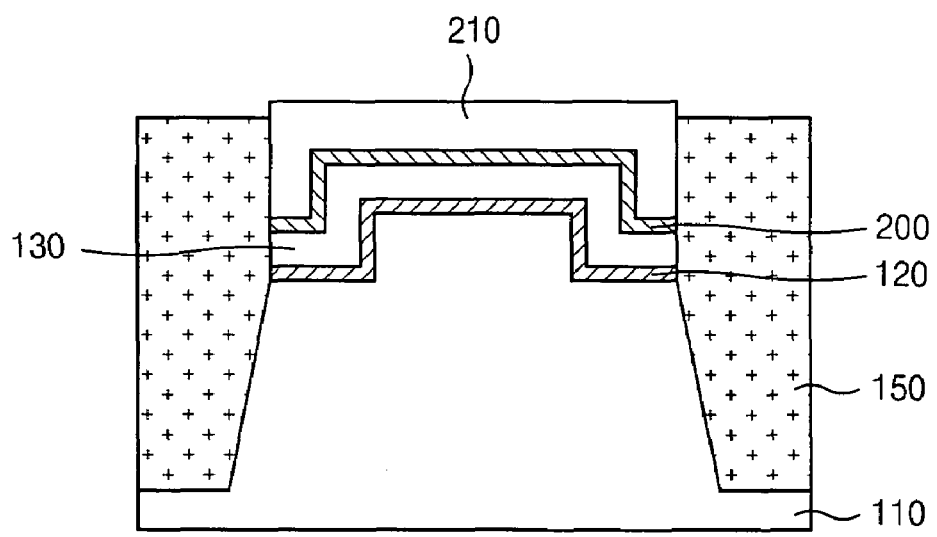

Referring to FIG. 2d, an oxide film (not shown) having a thickness ranging from 50 Å to 150 Å is formed on a surface of the trench 140. A liner nitride film (not shown) having a thickness ranging from 50 Å to 100 Å is then formed on the entire surface including the surface of the trench 140.

Next, a HDP oxide film (not shown) filling up the trench 140 is deposited. The HDP oxide film (not shown) is then subjected to a CMP process to expose the upper pad nitride film 210, whereby a device isolation film 150 is formed.

Figure 2E:
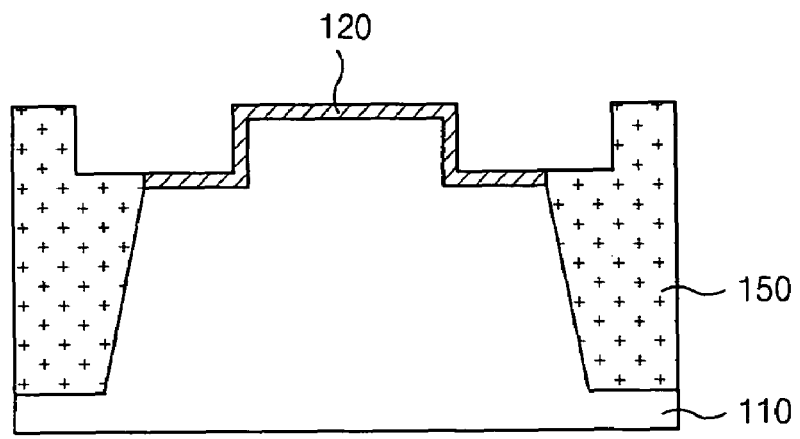

Referring to FIG. 2e, the upper pad nitride film 210, the upper pad oxide film 200 and the lower pad nitride film 130 are removed. Here, the removal process of films 210, 200 and 130 is preferably performed using a wet-etching method using a phosphorous acid solution.

Figure 2F:
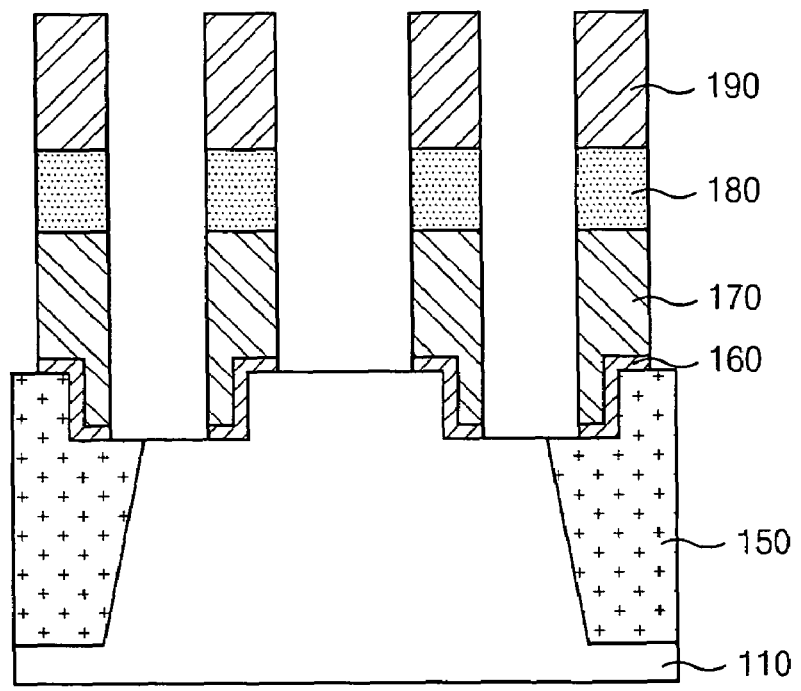

Referring to FIG. 2f, the lower pad oxide film 120 is removed. Thereafter, a stacked structure of a gate oxide film 160, a gate polysilicon layer 170, a gate silicide layer 180 and a hard mask nitride film 190 is deposited on the entire surface of the semiconductor substrate 110. The stacked structure is then patterned to form a gate having a stepped gate channel.

In accordance with one embodiment of the present invention, a buffer oxide film (not shown) may be formed on the semiconductor substrate 100 after the lower pad oxide film 120 is removed. The active region of the semiconductor substrate 100 may then be subjected to an ion-implant process.

In accordance with another embodiment of the present invention, after the formation of the gate, a bit line contact region of the semiconductor substrate 110 may further be subjected to an ion-implant process.

As described above, the method for fabricating a semiconductor device in accordance with the present invention provides an improved leakage current characteristic for the storage node junction by preventing gate oxide integrity degradation due to defect and minimizing the damage to the liner nitride film while maintaining the threshold voltage the same as that of a conventional method. Accordingly, the refresh characteristic of the semiconductor device is improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating a semiconductor device, comprising the steps of:
   (a) etching a predetermined region of a semiconductor substrate, wherein the predetermined region includes a storage node contact region and a portion of a gate region adjacent thereto;
   (b) sequentially forming a lower pad oxide film, a lower pad nitride film, an upper pad oxide film and an upper pad nitride film on the semiconductor substrate;
   (c) etching a predetermined region of the upper pad nitride film, the upper pad oxide film, the lower pad nitride film, the lower pad oxide film and the semiconductor substrate to form a trench defining an active region;
   (d) depositing a HDP oxide film filling up the trench;
   (e) subjecting the HDP oxide film to a CMP process to expose the upper pad nitride film;
   (f) removing the upper pad nitride film, the upper pad oxide film, the lower pad nitride film and the lower pad oxide film; and
   (g) depositing and patterning a gate oxide film, a gate polysilicon layer, a gate silicide layer and a hard mask nitride film to form a gate.

2. The method according to claim 1, wherein a thickness of the semiconductor substrate etched during the etching process in the step (a) ranges from 300 Å to 600 Å.

3. The method according to claim 1, wherein a thickness of the lower pad oxide film ranges from 30 Å to 150 Å.

4. The method according to claim 1, wherein a thickness of the lower pad nitride film ranges from 200 Å to 300 Å, and a thickness of the upper pad nitride film ranges from 300 Å to 400 Å.

5. The method according to claim 1, wherein a depth of the trench ranges from 2000 Å to 3000 Å.

6. The method according to claim 1, further comprising forming a sidewall oxide film having a thickness ranging from 50 Å to 150 Å on a sidewall of the trench.

7. The method according to claim 1, further comprising forming a liner nitride film having a thickness ranging from 50 Å to 100 Å on the entire surface prior to the formation of the HDP oxide film.

8. The method according to claim 1, wherein the removing process of the step (f) comprises a wet-etching process.

9. The method according to claim 1, further comprising, prior to the step (g),
   forming a sacrificial oxide film on the active region; and
   subjecting the active region to an ion implant process.

10. The method according to claim 1, further comprising exposing a portion of the semiconductor substrate where a bit line contact region is to be formed; and
    performing an ion implant process on the exposed portion of the semiconductor substrate.

* * * * *